(12) United States Patent
Kim et al.

(10) Patent No.: US 11,150,270 B2
(45) Date of Patent: Oct. 19, 2021

(54) TEST DEVICE

(71) Applicant: LEENO INDUSTRIAL INC., Busan (KR)

(72) Inventors: Geun-su Kim, Busan (KR); Jae-hwan Jeong, Busan (KR)

(73) Assignee: LEENO INDUSTRIAL INC.

( * ) Notice: Subject to any disclaimer, the term of this patent is extended or adjusted under 35 U.S.C. 154(b) by 10 days.

(21) Appl. No.: 16/737,122

(22) Filed: Jan. 8, 2020

(65) Prior Publication Data

US 2020/0141980 A1 May 7, 2020

Related U.S. Application Data

(63) Continuation of application No. PCT/KR2018/008989, filed on Aug. 7, 2018.

(30) Foreign Application Priority Data

Aug. 11, 2017 (KR) ......................... 10-2017-0102270

(51) Int. Cl.
*G01R 31/28* (2006.01)
*G01R 1/073* (2006.01)
*G01R 31/26* (2020.01)

(52) U.S. Cl.
CPC ..... *G01R 1/07364* (2013.01); *G01R 31/2601* (2013.01); *G01R 31/2879* (2013.01); *G01R 31/2889* (2013.01)

(58) Field of Classification Search
CPC .................. G01R 1/07307; G01R 1/07342
See application file for complete search history.

(56) References Cited

U.S. PATENT DOCUMENTS 6,069,481 A 5/2000 Matsumura
9,207,259 B2 * 12/2015 Hsu .................... G01R 1/06772
(Continued)

FOREIGN PATENT DOCUMENTS

CN 102183575 B 1/2013
JP 10189672 A 7/1998
(Continued)

OTHER PUBLICATIONS

Korean Office Action (KR 10-2017-0102270), KIPO, dated Aug. 15, 2018.
(Continued)

*Primary Examiner* — Tung X Nguyen
(74) *Attorney, Agent, or Firm* — Park & Associates IP Law, P.C.

(57) ABSTRACT

Disclosed is a test device for testing electric characteristics of an object to be tested. The test device comprises a test circuit board comprising an insulating base substrate formed with a printed circuit, a plurality of signal contact points connected to the printed circuit and applying a test signal to the object to be tested, and a substrate shielding portion formed in a thickness direction of the base substrate between the plurality of signal contact points; and a test socket comprising a plurality of signal pins to be in contact with the plurality of signal contact points, and a conductive block supporting the plurality of signal pins without contact. With this, a secure noise shield is made between lines for applying a test signal when a high-frequency and high-seed semiconductor is subjected to the test, thereby improving reliability of the test.

6 Claims, 5 Drawing Sheets

(56) References Cited

U.S. PATENT DOCUMENTS

| | | | | |
|---|---|---|---|---|
| 2013/0257470 | A1* | 10/2013 | Park | G01R 1/045 324/756.02 |
| 2015/0079815 | A1* | 3/2015 | Leigh | H01R 12/712 439/74 |
| 2016/0341790 | A1 | 11/2016 | Thompson et al. | |

FOREIGN PATENT DOCUMENTS

| | | |
|---|---|---|
| JP | 5193200 B2 | 5/2013 |
| JP | 201492539 A | 5/2014 |
| KR | 10-2006-0052285 A | 5/2006 |
| KR | 10-2010-0037431 A | 4/2010 |
| KR | 10-2016-0063825 A | 6/2016 |
| KR | 10-2016-0133422 A | 11/2016 |
| KR | 10-2017-0030783 A | 3/2017 |

OTHER PUBLICATIONS

International Search Report (PCT/KR2018/008989), WIPO, dated Dec. 14, 2018.
Korean Decision of Final Rejection (KR 10-2017-0102270), KIPO, dated Dec. 20, 2018.
Taiwan Office Action with Search Report (TW 107126737), TIPO, dated Jan. 9, 2019.
Korean Notice of Allowance (KR 10-2017-0102270), KIPO, dated Jan. 30, 2019.
Taiwan Notice of Allowance (TW 107126737), TIPO, dated May 27, 2019.

\* cited by examiner

TEST DEVICE

REFERENCE TO RELATED APPLICATIONS

This is a continuation of pending International Patent Application PCT/KR2018/008989 filed on Aug. 7, 2018, which designates the United States and claims priority of Korean Patent Application No. 10-2017-0102270 filed on Aug. 11, 2017, the entire contents of which are incorporated herein by reference.

FIELD OF THE INVENTION

The present disclosure relates to a test device for testing electric characteristics of a high-frequency and high-speed device to be tested, for example, a semiconductor.

BACKGROUND OF THE INVENTION

To test electric characteristics of an object to be tested such as a semiconductor, a test device has employed a probe socket for supporting a test probe, and a test circuit board for contacting the test probe and applying a test signal. As a high-frequency and high-speed semiconductor is decreased in pitch and increased in allowable current, a noise shield has become very important between signal probes of the probe socket.

FIG. 5 shows a conventional test device 10 that includes a probe socket 20 for supporting signal probes 22, and a test circuit board 30 placed under the probe socket 20 and providing a test signal. In the probe socket 20, a signal probe 12 is inserted in an engineering plastic block and performs a test. Further, the test circuit board 30 includes a conductive column 32 and the signal pad 34 which are formed on an insulating dielectric substrate and transmit the test signal. When the high-frequency and high-speed semiconductor and the like object required to have high isolation is subjected to the test, a conductive ground body has been used as a shield between the adjacent signal probes 22 of the probe socket 20. However, the test circuit board 30 is made of an insulating substrate, and therefore a problem of cross-talk still arises between the conductive columns 32 and between the signal pads 34. To improve test reliability, there is a need of maintenance to lower an isolation loss between signal lines in the high-frequency and high-speed semiconductor.

SUMMARY OF THE INVENTION

An aspect of the present disclosure is conceived to solve the conventional problems, and provides a test device which can lower cross-talk by high isolation between signal lines in a high-frequency and high-speed semiconductor.

In accordance with an embodiment of the present disclosure, there is provided a test device. The test device includes: a test circuit board comprising an insulating base substrate formed with a printed circuit, a plurality of signal contact points connected to the printed circuit and applying a test signal to the object to be tested, and a substrate shielding portion formed in a thickness direction of the base substrate between the plurality of signal contact points; and a test socket comprising a plurality of signal pins to be in contact with the plurality of signal contact points, and a conductive block supporting the plurality of signal pins without contact. The test device according to the present disclosure makes a securer noise shield between signal lines causing noise in a test circuit board, thereby improving reliability of the test.

The base substrate may comprise a shielding groove formed in a thickness direction, and the substrate shielding portion may be filled in the shielding groove.

The substrate shielding portion may be arranged surrounding the signal contact point.

The substrate shielding portion may comprise a conductive elastic body.

The signal contact point may comprise a conductive column filled in a through hole of penetrating the base substrate, and the substrate shielding portion may surround the conductive column.

The substrate shielding portion may be extended as a single body from the conductive block.

The test device according to the present invention has lower cross-talk characteristics by high isolation between signal lines in a high-frequency and high-speed semiconductor.

DETAILED DESCRIPTION OF THE INVENTION

Below, a test device 1 according to the present disclosure will be described in detail with reference to the accompanying drawings.

Figure 1:
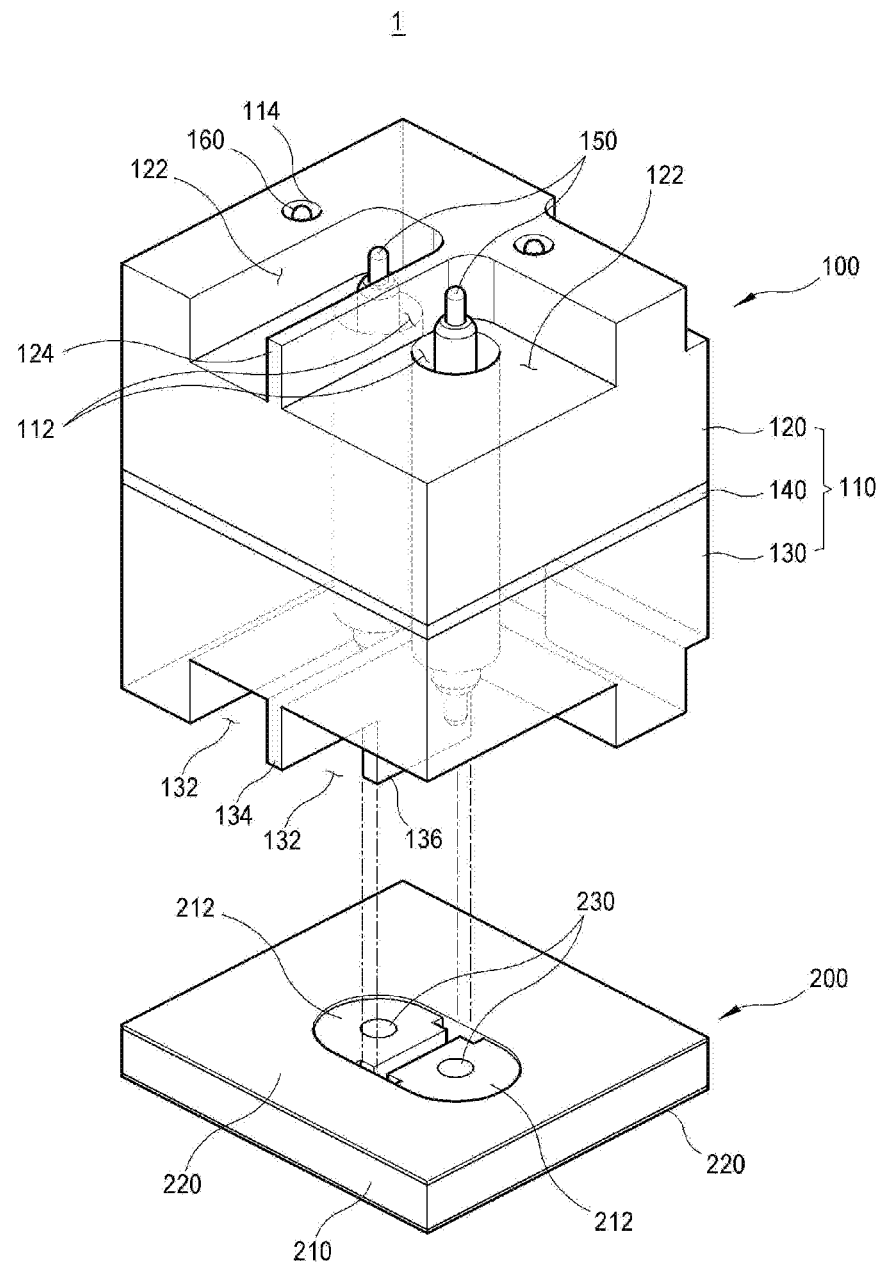
FIG. 1 is an exploded perspective view of a test device according to a first embodiment of the present disclosure.
Figure 2:
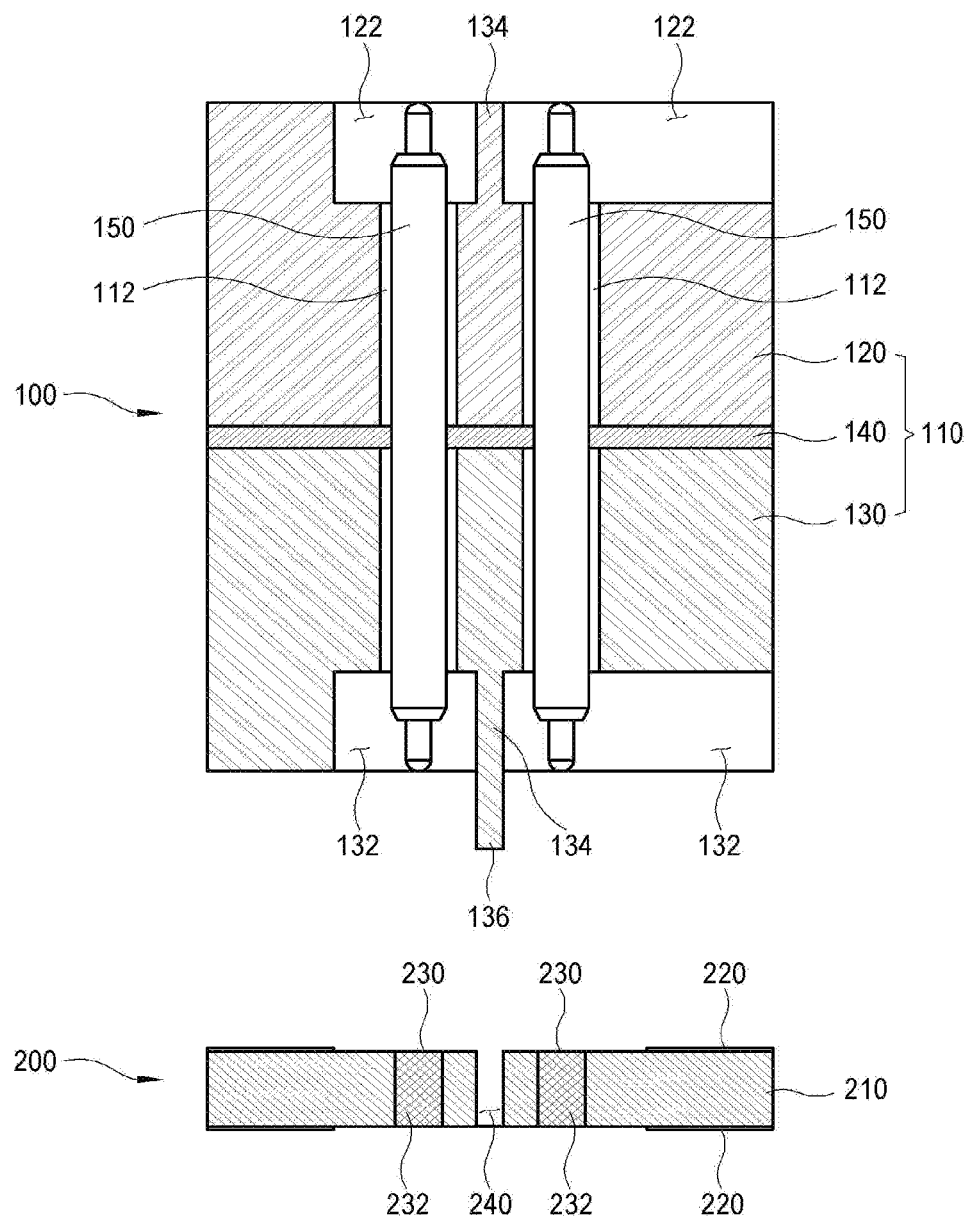
FIG. 2 is an exploded cross-section view of the test device in FIG. 1.
Figure 3:
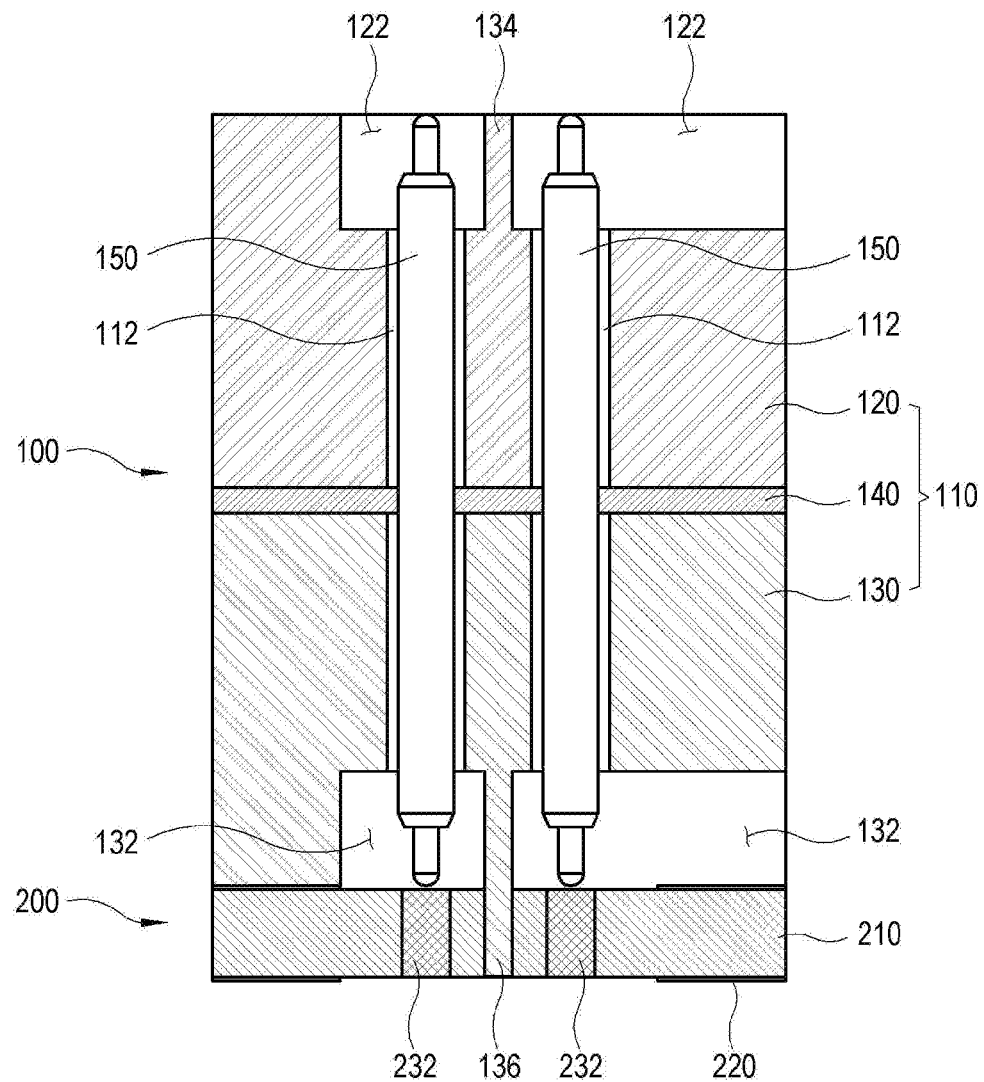
FIG. 3 is a coupled cross-section view of the test device in FIG. 1.

FIGS. 1 to 3 are an exploded perspective view, an exploded cross-section view and an assembled cross-section view of the test device 1 according to the first embodiment of the present disclosure. The test device 1 includes a probe socket 100 and a test circuit board 200.

The probe socket 100 includes a conductive block 110, a plurality of signal pins 150 for applying a test signal to a contact object, and at least one ground pin 160 to which a ground signal is applied. The conductive block 110 includes a signal pin hole 112 in which the plurality of signal pins 150 is accommodated without contact, and a ground pin hole 114 in which at least one ground pin 160 is accommodated with contact.

The conductive block 110 may be made of brass and the like conductive metal or material, plastic or ceramic superficially plated with a conductive material. The conductive block 110 includes an upper conductive block 120, a lower conductive block 130, and an insulating support member 140 interposed between the upper and lower conductive blocks 120 and 130.

The upper conductive block 120 includes a plurality of upper cover accommodating grooves 122 provided around a top portion of the plurality of signal pins 150 and recessed from a top surface, and an upper shielding wall 124 provided between the plurality of upper cover accommodating grooves 122. The upper cover accommodating groove 122 couples with and accommodates an upper insulating cover (not shown) for supporting an upper end of the signal pin 150.

The lower conductive block 130 includes a plurality of lower cover accommodating grooves 132 provided around a bottom portion of the plurality of signal pins 150 and recessed from a bottom surface, a lower shielding wall 134 provided between the plurality of lower cover accommodating grooves 132, and a substrate shielding portion 136 extended toward the test circuit board 200. The lower cover accommodating groove 132 couples with and accommodates a lower insulating cover (not shown) for supporting a lower end of the signal pin 150.

The lower shielding wall 134 shields noise between the lower ends of the plurality of signal pins 150.

The substrate shielding portion 136 is additionally extended from the lower shielding wall 134 and inserted in a shielding groove 240 of the test circuit board 200 to be described later. The substrate shielding portion 136 is extended having a '-' shaped cross-section. Alternatively, as shown in FIGS. 1 and 2, the substrate shielding portion 136 may be extended having an 'H' shaped cross-section corresponding to the shielding groove 240 having an 'H' shape in the test circuit board 200. The substrate shielding portion 136 may be not necessarily extended from the lower shielding wall 134 but may protrude from the lower conductive block 130 as long as it can be inserted in the shielding groove 240 of the test circuit board 200.

The insulating support member 140 is made of an insulating plate. The insulating support member 140 includes a plurality of signal holes 142 for accommodating and supporting the signal pin 150. The signal hole 142 is formed at a position corresponding to the signal pin hole 112. The signal hole 142 has a smaller inner diameter than the signal pin hole 112 and has the same outer diameter as the signal pin 150.

The signal pin 150 transmits a test signal for a test to a power terminal of an object to be tested. The signal pin 150 is shaped like a pogo pin without limitations, and includes a hollow barrel, an upper plunger partially inserted in an upper side of the barrel, a lower plunger partially inserted in a lower side of the barrel, and a spring interposed between the upper plunger and the lower plunger within the barrel. The signal pin 150 includes the upper plunger of which the end is in contact with the power terminal of the object to be tested, and the lower plunger of which the end is in contact with a signal contact point 230 of the test circuit board 200.

The ground pin 160 receives a ground voltage through a ground terminal of the object to be tested after test power is applied to the object to be tested. The ground pin 160 has a structure similar to the signal pin 150, and includes a hollow barrel, an upper plunger partially inserted in an upper side of the barrel, a lower plunger partially inserted in a lower side of the barrel, and a spring interposed between the upper plunger and the lower plunger within the barrel. The upper and lower plungers of the ground pin 160 are in contact with the ground terminal of the object to be tested and a ground layer 220 of the test circuit board 200.

The test circuit board 200 includes an insulating base substrate 210, the conductive ground layers 220 arranged the top and bottom surfaces of the insulating base substrate 210, a plurality of signal contact points 230 arranged on the insulating base substrate 210, and the shielding groove 240 formed between the plurality of signal contact points 230 and recessed in a thickness direction.

The base substrate 210 is provided as an insulating substrate made of a dielectric material, ceramic, plastic, etc.

The base substrate 210 includes an exposure portion 212 exposed without forming the ground layer 220 around the signal contact point 230 so that the conductive ground layers 220 covering the top and bottom surfaces of the base substrate 210 cannot be in contact with the signal contact point 230. The base substrate 210 is formed with a printed circuit (not shown) for applying the test signal. The printed circuit may be arranged at least one of the top, bottom and middle of the base substrate 210.

The ground layer 220 is made of copper (Cu) and the like conductive material with which the top and bottom surfaces of the base substrate 210 are plated for a ground.

The signal contact point 230 includes a conductive column 232 filled in a through hole of penetrating the base substrate 210. That is, the signal contact point 230 refers to a portion of the conductive column 232, which is exposed to the top surface of the base substrate 210. The signal contact point 230 may be formed to have a larger area on the top surface of the base substrate 210 by additional plating of the exposed portion.

The shielding groove 240 is recessed in the thickness direction surrounding the signal contact point 230 and the conductive column 232. FIG. 1 illustrates the shielding groove 240 having an 'H' shape. Alternatively, the shielding groove 240 may have various shapes corresponding to arrangement of the conductive columns 232. The shielding groove 240 accommodates the substrate shielding portion 136 of the probe socket 100 when the test circuit board 200 and the probe socket 100 are coupled for the test as shown in FIG. 3. Here, the shielding groove 240 may be designed by taking the position of the surrounding conductive column 232 into account.

FIGS. 1 to 3 illustrate the test circuit board 200 as a single-layered substrate. Alternatively, the test circuit board 200 may be provided as a multi-layered substrate. Further, the conductive column 232 is not essential, but may be materialized as a printed circuit pattern formed on the top surface of the base substrate 210.

Figure 4:
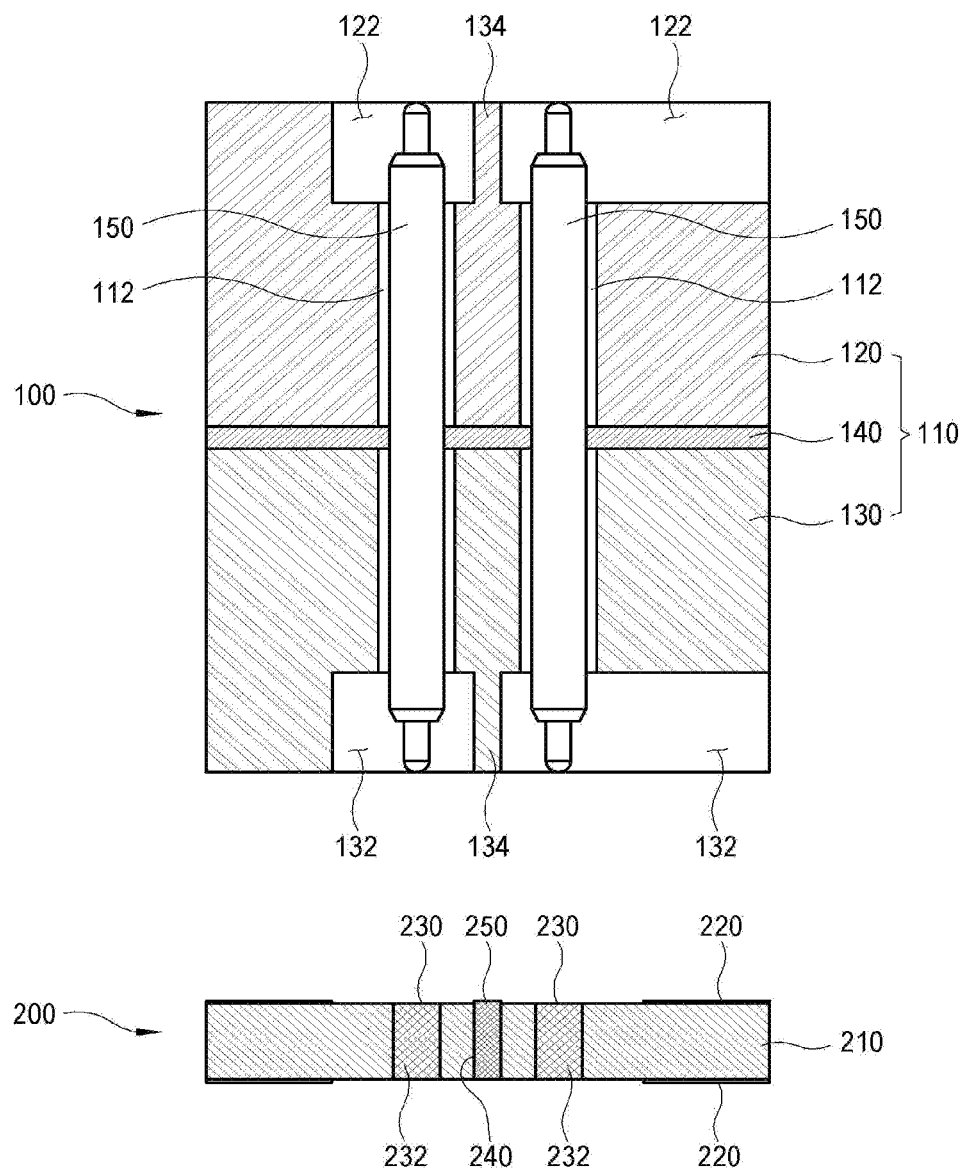
FIG. 4 is an exploded cross-section view of a test device according to a second embodiment of the present disclosure.
Figure 5:
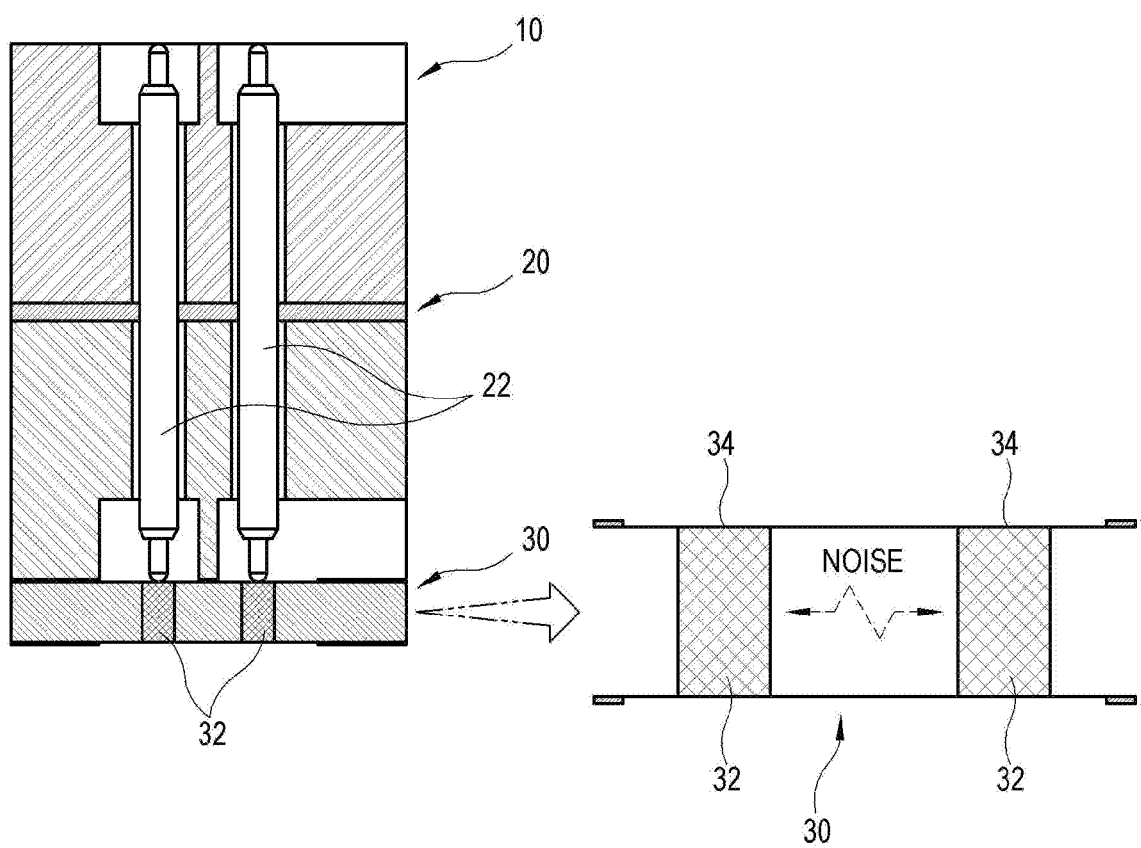
FIG. 5 is a cross-section view of a conventional test device.

FIG. 4 is an exploded cross-section view of a test device 1 according to a second embodiment of the present disclosure. Like numerals refer to like elements as compared with FIG. 1, and descriptions thereof will be omitted for conciseness. The test device 1 includes a probe socket 100 and a test circuit board 200.

The probe socket 100 includes a conductive block 110, a plurality of signal pins 150 for applying a test signal to a contact object, and at least one ground pin 160 to which a ground signal is applied. The conductive block 110 includes a signal pin hole 112 in which the plurality of signal pins 150 is accommodated without contact, and a ground pin hole 114 in which at least one ground pin 160 is accommodated with contact.

The conductive block 110 may be made of brass and the like conductive metal or material, plastic or ceramic plated with a conductive substance. The conductive block 110 includes an upper conductive block 120, a lower conductive block 130, and an insulating support member 140 interposed between the upper and lower conductive blocks 120 and 130.

The upper conductive block 120 includes a plurality of upper cover accommodating grooves 122 provided around a top portion of the plurality of signal pins 150 and recessed from a top surface, and an upper shielding wall 124 provided between the plurality of upper cover accommodating grooves 122. The upper cover accommodating groove 122 couples with and accommodates an upper insulating cover (not shown) for supporting an upper end of the signal pin 150.

The lower conductive block 130 includes a plurality of lower cover accommodating grooves 132 provided around a bottom portion of the plurality of signal pins 150 and recessed from a bottom surface, and a lower shielding wall 134 provided between the plurality of lower cover accommodating grooves 132. The lower cover accommodating groove 132 couples with and accommodates a lower insulating cover (not shown) for supporting a lower end of the signal pin 150. The lower shielding wall 134 shields noise between the lower ends of the plurality of signal pins 150.

The test circuit board 200 includes an insulating base substrate 210, the conductive ground layers 220 arranged the top and bottom surfaces of the insulating base substrate 210, and a conductive substrate shielding portion 250 filled in a shielding groove 240 recessed between the plurality of signal contact points 230.

The base substrate 210 is provided as an insulating substrate made of a dielectric material, ceramic, plastic, etc. The base substrate 210 includes an exposure portion 212 exposed without forming the ground layer 220 around the signal contact point 230 so that the conductive ground layers 220 covering the top and bottom surfaces of the base substrate 210 cannot be in contact with the signal contact point 230.

The ground layer 220 is made of copper (Cu) and the like conductive material with which the top and bottom surfaces of the base substrate 210 are plated for a ground.

The signal contact point 230 includes a conductive column 232 filled in a through hole of penetrating the base substrate 210. That is, the signal contact point 230 refers to a portion of the conductive column 232, which is exposed to the top surface of the base substrate 210. The signal contact point 230 may be formed to have a larger area on the top surface of the base substrate 210 by additional plating of the exposed portion.

The shielding groove 240 is recessed in the thickness direction surrounding the signal contact point 230 and the conductive column 232.

The substrate shielding portion 250 is provided as a conductive substance and filled in the shielding groove 240. The substrate shielding portion 250 is in contact with an end portion of the lower shielding wall 134 in the lower conductive block 130 of the probe socket 100 and receives a ground voltage. In this case, for close contact and flatness between the substrate shielding portion 250 and the lower shielding wall 134, the substrate shielding portion 250 filled in the shielding groove 240 can be a conductive elastic material. Alternatively, the substrate shielding portion 250 may be connected to the ground layer 220.

When a high-frequency and high-speed semiconductor and the like object required to have high isolation is subjected to the test, the test device of the present disclosure makes a securer shield between the lines for transmitting the test signal in the test circuit board, thereby surely improving reliability of the test.

Although the present disclosure is described through a few exemplary embodiments and drawings, the present invention is not limited to the foregoing exemplary embodiments and it will be appreciated by a person having an ordinary skill in the art that various modifications and changes can be made from these embodiments.

Therefore, the scope of the present disclosure has to be defined by not the exemplary embodiments but appended claims and the equivalents.

What is claimed is:

1. A test device for testing electric characteristics of an object to be tested, the test device comprising:
    a test circuit board comprising an insulating base substrate and having a printed circuit formed in the insulating base substrate, a plurality of signal contact points formed on the insulating base substrate for applying a test signal to the object to be tested, and a conductive substrate shielding portion received in a shielding groove formed in a thickness direction of the insulating base substrate between the plurality of signal contact points; and
    a test socket comprising a plurality of signal pins to be in contact with the plurality of signal contact points, and a conductive block adapted to support the plurality of signal pins without contact,
    wherein the conductive block includes a lower conductive shielding wall extended downwards from a lower surface of the conductive block,
    wherein, when the test socket is assembled to the test circuit board, the lower conductive shielding wall is configured to provide a sealed contact with the conductive substrate shielding portion of the test circuit board to shield noise between lower ends of the signal pins.

2. The test device according to claim 1, wherein the conductive substrate shielding portion is arranged to at least partially surround each of the plurality of signal contact points to shield noise between lower ends of the signal pins.

3. The test device according to claim 1, wherein the conductive substrate shielding portion is formed with a conductive elastic material, and a height of the conductive substrate shielding portion is protruded slightly higher than an upper surface of the insulating base substrate before the test socket is assembled to the test circuit board.

4. The test device according to claim 1, wherein
    the signal contact points are in form of a conductive column filled in a plurality of through holes penetrated the base substrate, and
    the conductive substrate shielding portion surrounds each conductive column at least partially.

5. A test device for testing electric characteristics of an object to be tested, the test device comprising:
    a test circuit board comprising an insulating base substrate and having a printed circuit formed in the insulating base substrate, a plurality of signal contact points formed on the insulating base substrate for applying a test signal to the object to be tested, and a shielding groove formed in a thickness direction of the insulating base substrate between the plurality of signal contact points; and
    a test socket comprising a plurality of signal pins to be in contact with the plurality of signal contact points, and a conductive block adapted to support the plurality of signal pins without contact,
    wherein the conductive block includes a lower conductive shielding wall extended downwards from a lower surface of the conductive block, and the lower conductive shielding wall includes a conductive substrate shielding portion extended further downwards from the conductive shielding wall,
    wherein, when the test socket is assembled to the test circuit board, the conductive substrate shielding portion of the conductive block is configured to be inserted to the shielding groove of the insulating base substrate, such that the conductive substrate shielding portion and the lower conductive shielding wall shield noise between lower ends of the signal pins.

6. The test device according to claim 5, wherein the conductive substrate shielding portion is arranged to at least partially surround each of the plurality of signal contact points to shield noise between lower ends of the signal pins.

\* \* \* \* \*